United States Patent
Park

(10) Patent No.: US 7,800,397 B2
(45) Date of Patent: Sep. 21, 2010

(54) ON-DIE TERMINATION CIRCUIT OF SEMICONDUCTOR MEMORY APPARATUS

(75) Inventor: Jung-Hoon Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 100 days.

(21) Appl. No.: 11/878,924

(22) Filed: Jul. 27, 2007

(65) Prior Publication Data

US 2008/0224728 A1 Sep. 18, 2008

(30) Foreign Application Priority Data

Mar. 12, 2007 (KR) .................... 10-2007-0023867

(51) Int. Cl.
*H03K 17/16* (2006.01)
*H03K 19/003* (2006.01)
(52) U.S. Cl. .................. 326/30; 327/109; 365/225.7
(58) Field of Classification Search ............... 326/26, 326/27, 86, 87; 327/108, 109; 365/51, 189.07, 365/191, 198, 225.7; 333/17.2, 32
See application file for complete search history.

(56) References Cited

U.S. PATENT DOCUMENTS

| 6,281,709 | B1* | 8/2001 | Seyyedy ................. 326/87 |
| 6,710,618 | B1 | 3/2004 | Murray |
| 6,762,620 | B2* | 7/2004 | Jang et al. .............. 326/30 |
| 6,809,546 | B2 | 10/2004 | Song et al. |
| 6,928,007 | B2 | 8/2005 | Jin |
| 6,958,613 | B2 | 10/2005 | Braun et al. |
| 6,980,020 | B2 | 12/2005 | Best et al. |
| 7,151,390 | B2 | 12/2006 | Nguyen et al. |
| 7,170,313 | B2 | 1/2007 | Shin |
| 7,176,711 | B2 | 2/2007 | Park et al. |
| 2003/0218477 | A1* | 11/2003 | Jang et al. ............... 326/30 |
| 2004/0113652 | A1* | 6/2004 | Lundberg ............... 326/30 |
| 2005/0012533 | A1* | 1/2005 | Aoyama et al. ......... 327/170 |
| 2005/0226080 | A1 | 10/2005 | Lee |
| 2005/0242832 | A1 | 11/2005 | Shin |
| 2005/0253615 | A1 | 11/2005 | Sunwoo et al. |
| 2007/0146004 | A1* | 6/2007 | Park et al. .............. 326/30 |

FOREIGN PATENT DOCUMENTS

| JP | 2002-150788 | 5/2002 |
| JP | 2004310981 | 11/2004 |
| JP | 2005228458 | 8/2005 |
| JP | 2005285125 | 10/2005 |
| JP | 2006129423 | 5/2006 |
| KR | 1020030089314 | 11/2003 |
| KR | 1020060038234 | 5/2006 |
| KR | 100656456 | 12/2006 |
| KR | 100656461 | 12/2006 |

* cited by examiner

*Primary Examiner*—Vibol Tan
*Assistant Examiner*—Dylan White
(74) *Attorney, Agent, or Firm*—Venable LLP; Jeffri A. Kaminski; Leigh D. Thelen

(57) ABSTRACT

An on-die termination circuit of a semiconductor memory apparatus includes a comparator that compares a voltage corresponding to a normal code with a reference voltage to output a comparison signal. A code adjusting unit varies the normal code according to the comparison signal, outputs the varied normal code, and resets the normal code to a predetermined reset code or a variable fuse code.

25 Claims, 8 Drawing Sheets

[FIG. 2]
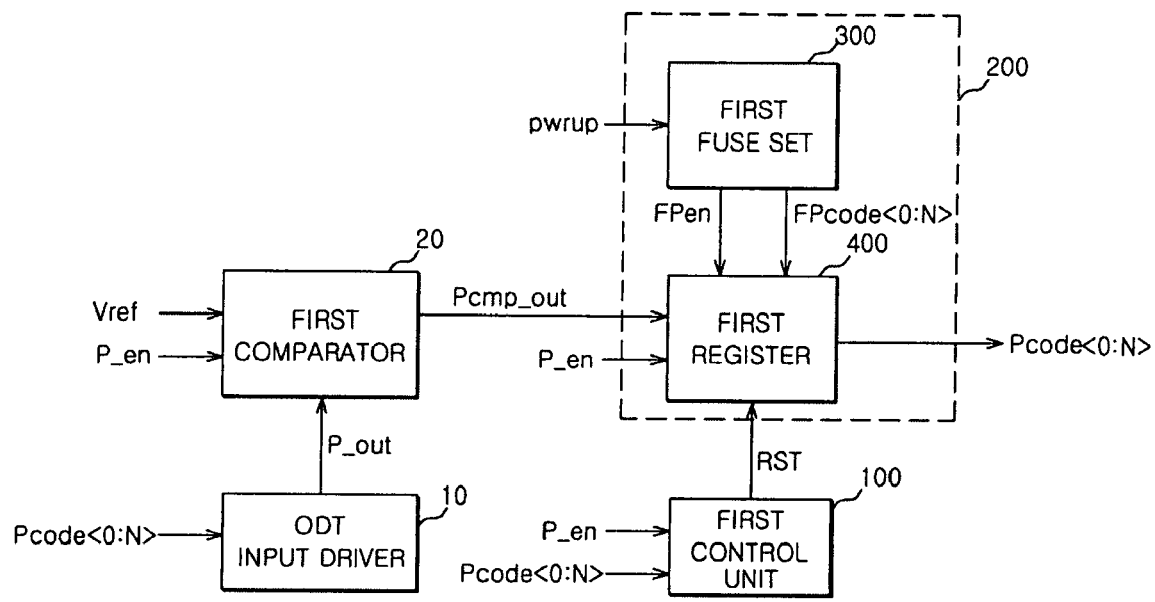
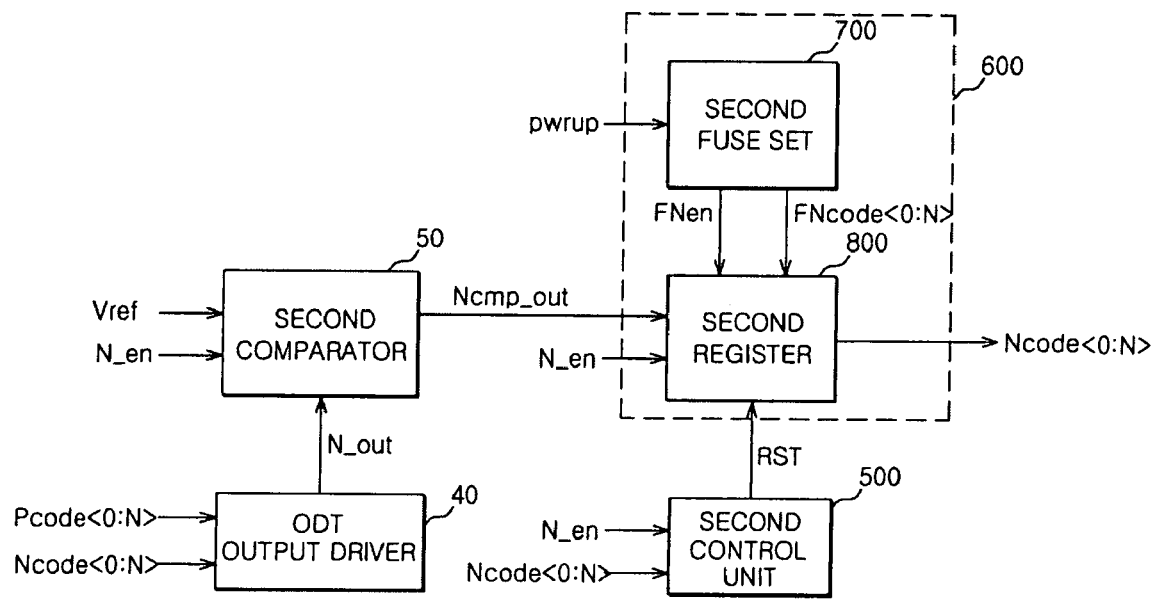

[FIG. 3]
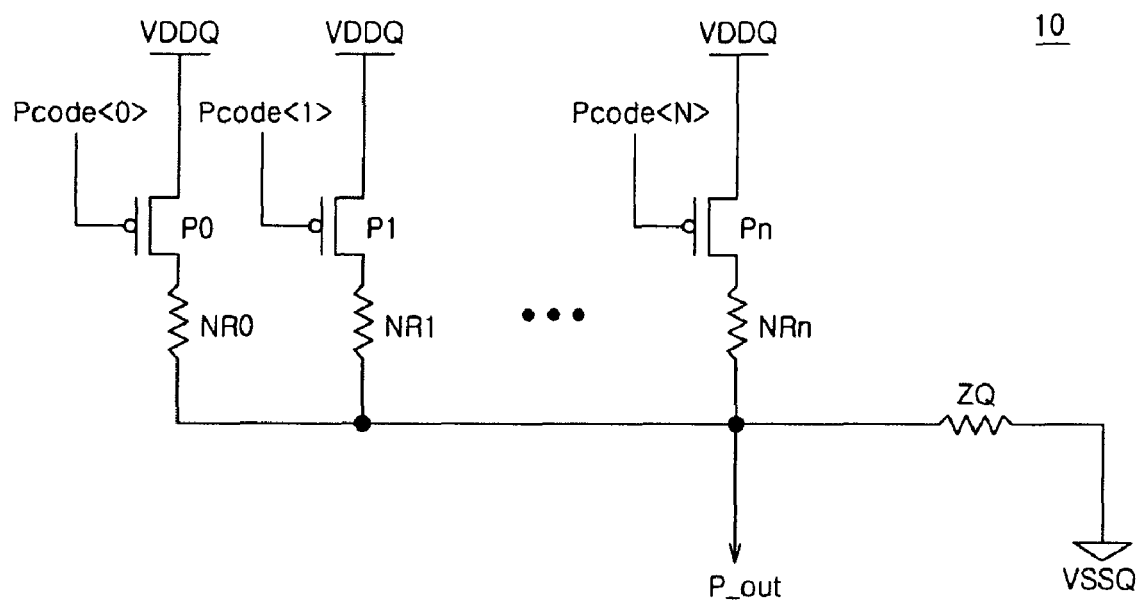
[FIG. 4]
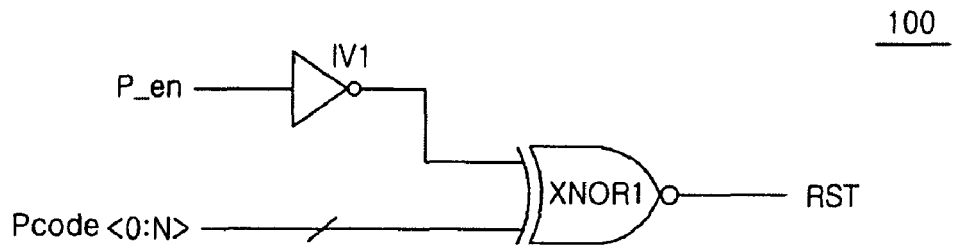

[FIG. 5]
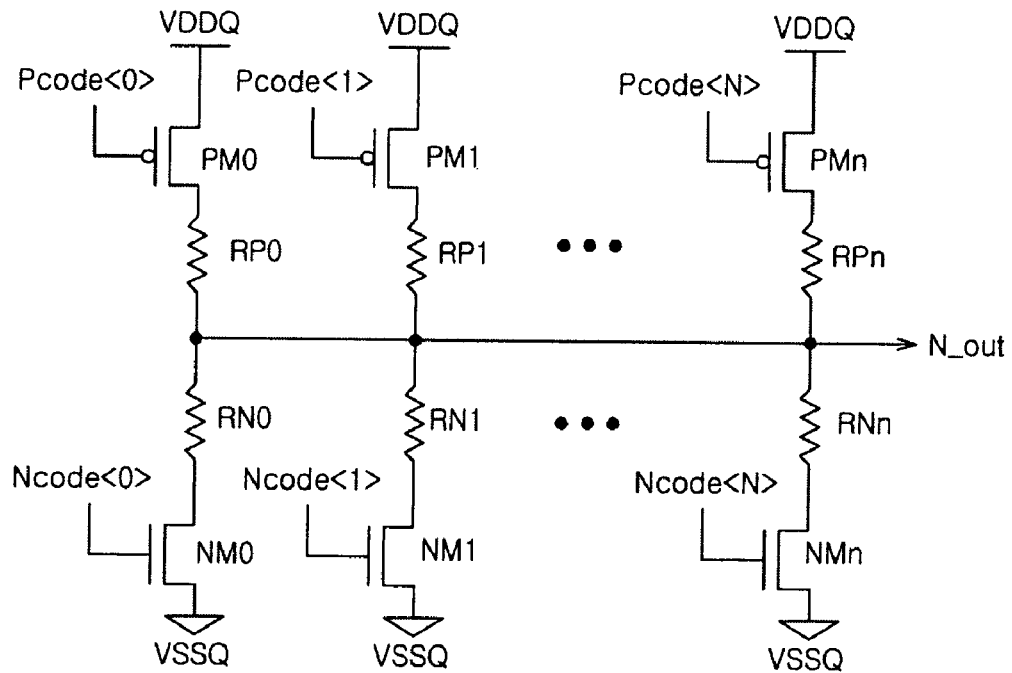
[FIG. 6]
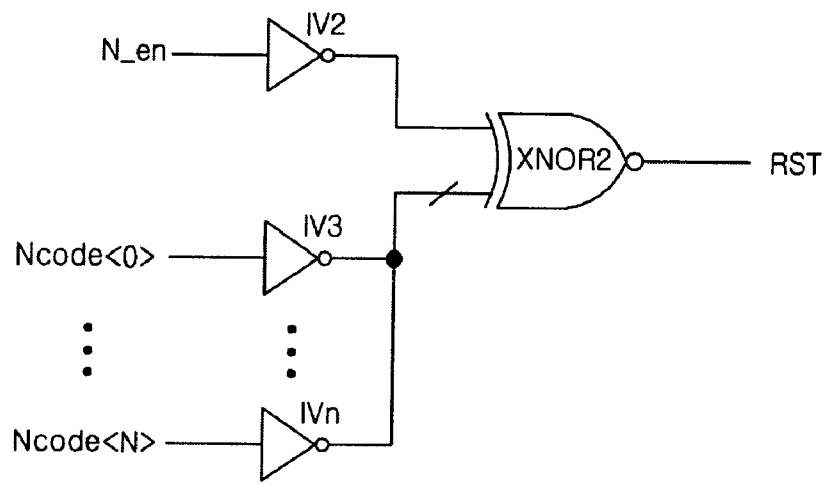

[FIG. 8]
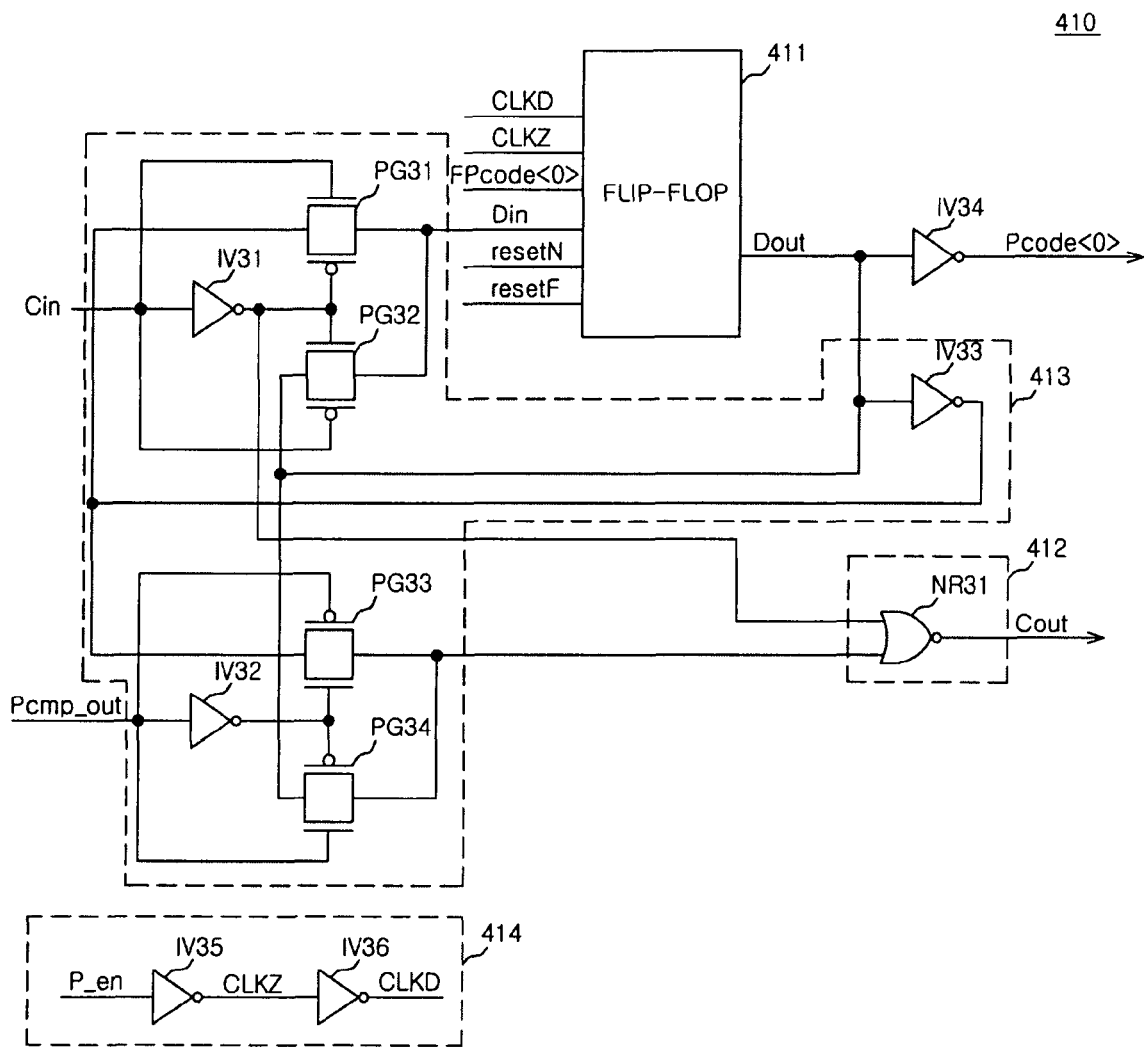

[FIG. 9]
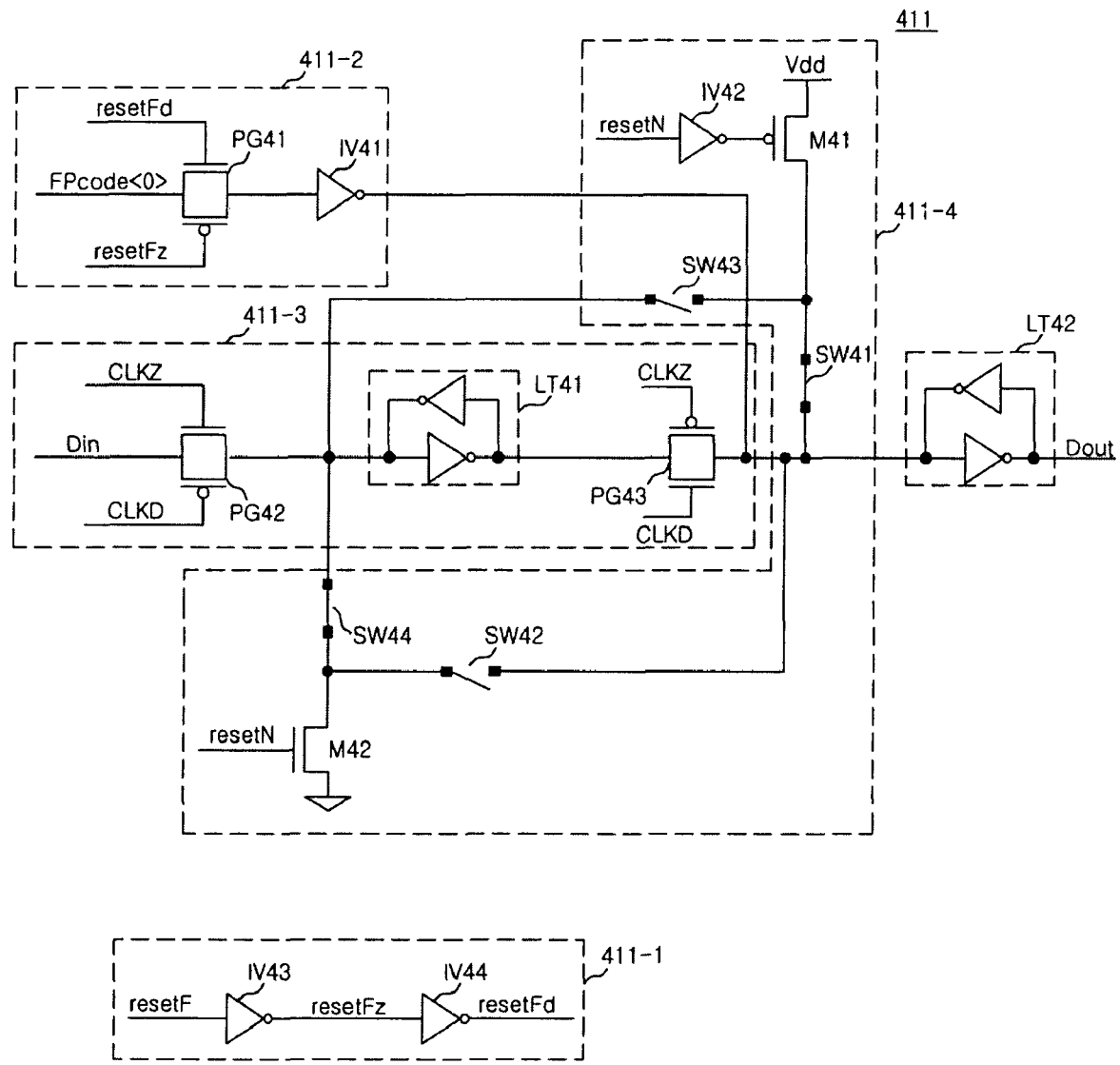

[FIG. 10]
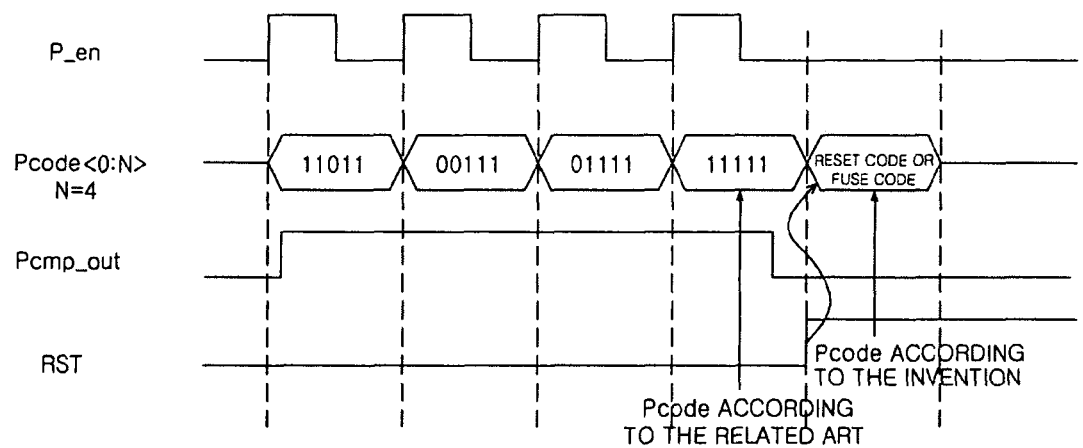
[FIG. 11]
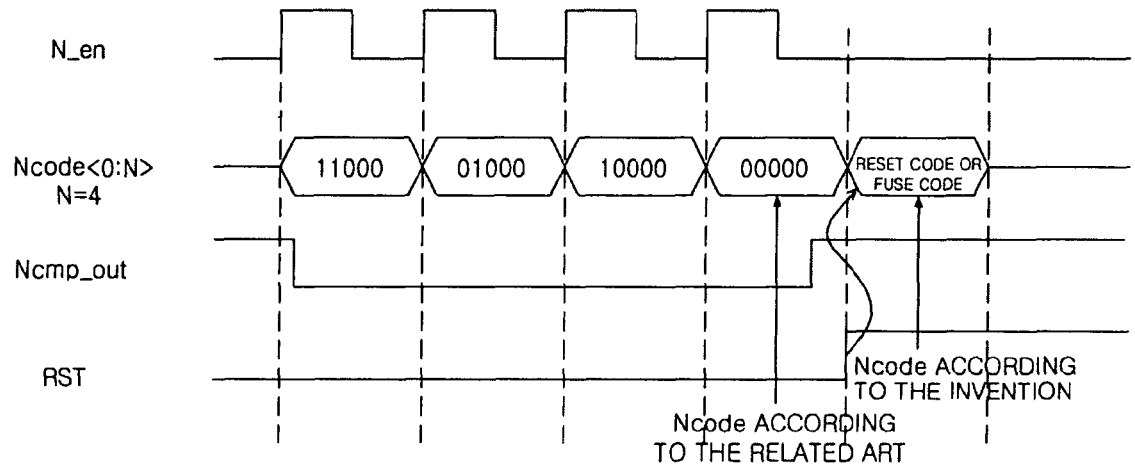

ON-DIE TERMINATION CIRCUIT OF SEMICONDUCTOR MEMORY APPARATUS

CROSS-REFERENCE TO RELATED PATENT APPLICATION

This application claims the benefit of Korean Patent Application No. 10-2007-0023867, filed on Mar. 12, 2007, in the Korean Intellectual Property Office, the disclosure of which is incorporated herein in its entirety by reference.

BACKGROUND OF THE INVENTION

1. Technical Field

Embodiments of the present invention relate to a semiconductor memory apparatus, and more particularly, to an on-die termination circuit of a semiconductor memory apparatus.

2. Related Art

In general, when signals transmitted through a bus line having a predetermined impedance are input to another bus line having a different impedance, a signal loss occurs. Therefore, impedance matching between the two bus lines is needed to reduce the signal loss, which is referred to as on-die termination.

As shown in FIG. 1, an on-die termination apparatus according to the related art includes: an ODT input driver 10 that divides a power supply voltage VDDQ at a resistance ratio corresponding to a first code Pcode<0:N> and outputs a first line voltage P_out; a first comparator 20 that compares the first line voltage P_out with a reference voltage Vref according to a first code adjustment enable signal P_en and outputs a first comparison signal Pcmp_out; a first register 30 that counts the first code Pcode<0:N> according to the first comparison signal Pcmp_out; an ODT output driver 40 that divides the power supply voltage VDDQ at a resistance ratio corresponding to a second code Ncode<0:N> and outputs a second line voltage N_out; a second comparator 50 that compares the second line voltage N_out with the reference voltage Vref according to a second code adjustment enable signal N_en and outputs a second comparison signal Ncmp_out; and a second register 60 that counts the second code Ncode<0:N> according to the second comparison signal Ncmp_out. The ODT input driver 10 is modeled in the same manner as that in which a data input driver is modeled. The ODT output driver 40 is modeled in the same manner as that in which a data output driver is modeled.

Next, a code adjusting process according to the related art will be described below.

A process for adjusting the first code Pcode<0:N> and a process for adjusting the second code Ncode<0:N> may be performed at the same time, or they may be performed sequentially.

The process for adjusting the first code Pcode<0:N> is performed as follows.

The first code Pcode<0:N> having a predetermined value set by the first register 30 is input to the ODT input driver 10.

The ODT input driver 10 divides the power supply voltage VDDQ at a resistance ratio of resistors that are connected according to the first code Pcode<0:N> and a line impedance detecting resistor and outputs the first line voltage P_out.

The first comparator 20 compares the first line voltage P_out and the reference voltage Vref according to the first code adjustment enable signal P_en and outputs the first comparison signal Pcmp_out.

The first register 30 counts the first code Pcode<0:N> according to the first comparison signal Pcmp_out.

The ODT input driver 10 feeds back the first line voltage P_out corresponding to the counted first code Pcode<0:N> to the first comparator 20.

The first comparator 20 receives the first line voltage P_out and repeatedly performs the comparing operation and an operation for outputting the first comparison signal Pcmp_out.

The first code adjustment enable signal P_en is inactivated after a predetermined time.

When the first code adjustment enable signal P_en is inactivated, the first comparator 20 and the first register 30 stop, and at that time, the first code Pcode<0:N> is stored.

The process for adjusting the second code Ncode<0:N> is performed as follows.

An initial first code Ncode<0:N> set by the second register 60 is input to the ODT output driver 40.

The ODT output driver 40 divides the power supply voltage VDDQ at a resistance ratio of resistors that are connected according to the first and second codes Pcode<0:N> and Ncode<0:N> and outputs a second line voltage N_out.

The second comparator 50 compares the second line voltage N_out and the reference voltage Vref according to the second code adjustment enable signal N_en and outputs the second comparison signal Ncmp_out.

The second register 60 counts the second code Ncode<0:N> according to the second comparison signal Ncmp_out.

The ODT output driver 40 feeds back the second line voltage N_out corresponding to the counted second code Ncode<0:N> to the second comparator 50. The second comparator 50 repeatedly performs the comparing operation and an operation for outputting the second comparison signal Ncmp_out according to the second line voltage N_out.

The second code adjustment enable signal N_en is inactivated after a predetermined time.

When the second code adjustment enable signal N_en is inactivated, the second comparator 50 and the second register 60 stop, and at that time, the second code Ncode<0:N> is stored.

In the related art, when the reference voltage Vref is higher than the first line voltage P_out and the second line voltage N_out during the adjustment of the first and second codes Pcode<0:N> and Ncode<0:N>, the resistance value should increase. When the resistance value increases, the first code Pcode<0:N> increases, but the second code Ncode<0:N> decreases.

The first line voltage P_out and the second line voltage N_out may be considerably higher than the reference voltage Vref due to external and internal factors of the semiconductor memory apparatus. For example, when an external resistor is not connected to an external resistor connecting pin, a high impedance is generated.

When the first line voltage P_out and the second line voltage N_out are considerably higher than the reference voltage Vref, the first code Pcode<0:N> is continuously increased to reach a maximum value. As a result, the resistance value becomes infinity. Similarly, the second code Ncode<0:N> is continuously decreased to reach a minimum value. As a result, the resistance value becomes infinity.

The on-die termination circuit of the semiconductor memory apparatus according to the related art has a problem in that a code adjustment error occurs in which the first code Pcode<0:N> is adjusted to the maximum value and the second code Ncode<0:N> is adjusted to the minimum value, so that the resistance value becomes infinity, which makes it difficult to normally input and output data.

SUMMARY

An embodiment of the present invention may provide an on-die termination circuit of a semiconductor memory apparatus capable of preventing errors during the adjustment of codes.

Another embodiment of the invention may provide an on-die termination circuit of a semiconductor memory apparatus that may be capable of adjusting a code value to adapt to PVT (process, voltage, and temperature) variations.

According to an embodiment of the invention, an on-die termination circuit of a semiconductor memory apparatus includes: a comparator that may compare a voltage corresponding to a normal code with a reference voltage to output a comparison signal; and a code adjusting unit that may vary the normal code according to the comparison signal, output the varied normal code, and reset the normal code to a predetermined reset code or a variable fuse code.

BRIEF DESCRIPTION OF THE DRAWINGS

FIG. 2 is a block diagram illustrating an exemplary on-die termination circuit of a semiconductor memory apparatus according to an embodiment of the invention.

FIG. 3 is a circuit diagram illustrating an exemplary ODT input driver shown in FIG. 2.

FIG. 4 is a circuit block diagram illustrating an exemplary first control unit shown in FIG. 2.

FIG. 5 is a circuit diagram illustrating an exemplary ODT output driver shown in FIG. 2.

FIG. 6 is a circuit block diagram illustrating an exemplary second control unit shown in FIG. 2.

FIG. 8 is a circuit block diagram illustrating an exemplary counter shown in FIG. 7.

FIG. 9 is a circuit block diagram illustrating an exemplary flip-flop shown in FIG. 8.

FIG. 10 is a timing chart illustrating an exemplary first code adjusting method according to an embodiment of the invention.

FIG. 11 is a timing chart illustrating an exemplary second code adjusting method according to an embodiment of the invention.

DESCRIPTION OF EXEMPLARY EMBODIMENT

Figure 1:
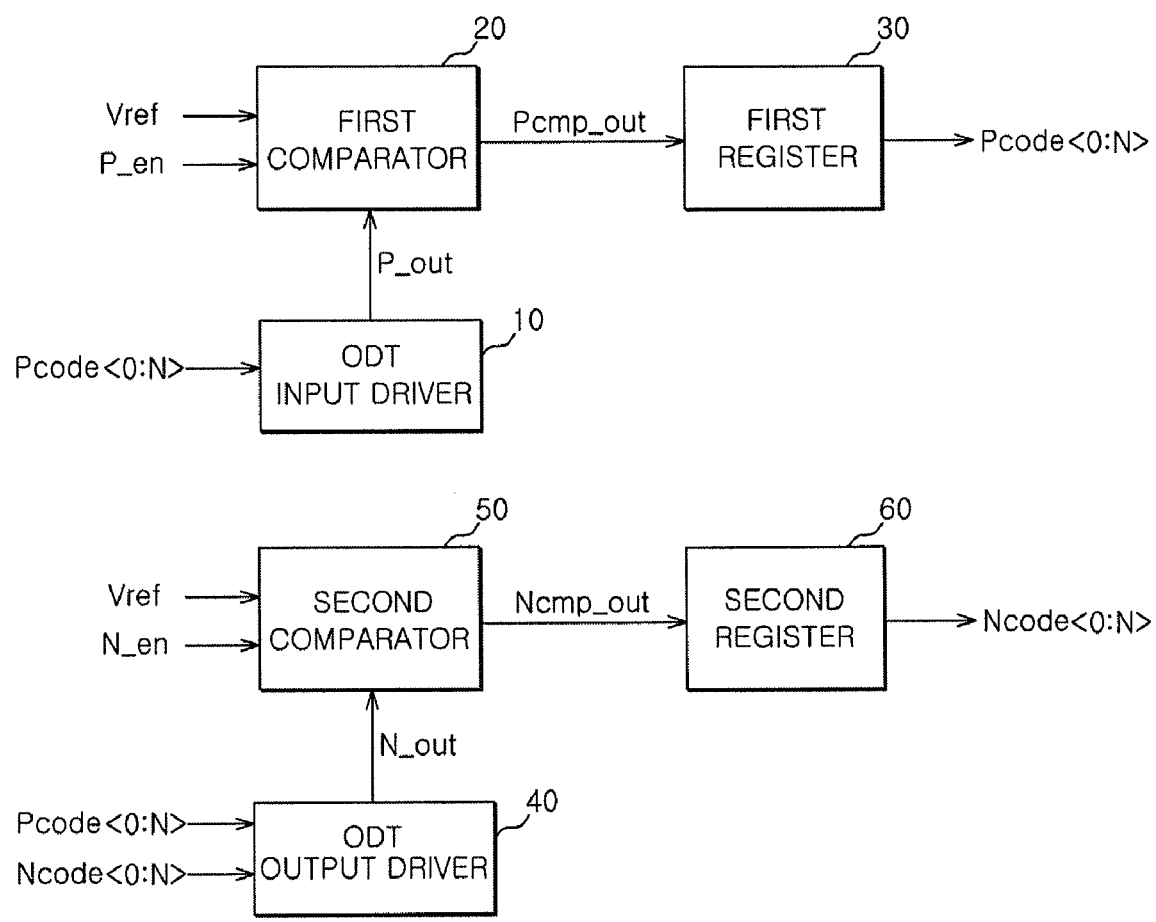
FIG. 1 is a block diagram illustrating an exemplary on-die termination circuit of a semiconductor memory apparatus according to the related art.

An on-die termination circuit of a semiconductor memory apparatus according to an exemplary embodiment of the present invention will now be described in detail with reference to the accompanying drawings.

As shown in FIG. 2, an exemplary on-die termination circuit of a semiconductor memory apparatus according to an embodiment of the invention may include an ODT input driver 10, a first comparator 20, a first control unit 100, a first code adjusting unit 200, an ODT output driver 40, a second comparator 50, a second control unit 500, and a second code adjusting unit 600.

The ODT input driver 10 may divide a power supply voltage VDDQ at a resistance ratio corresponding to a first code Pcode<0:N> and output a first line voltage P_out. The ODT input driver 10 may be modeled in the same manner as a data input driver.

As shown in FIG. 3, the exemplary ODT input driver 10 may include, for example, a plurality of transistors P0 to Pn that may be coupled to a power supply terminal VDDQ and turned on in response to the first code Pcode<0:N> and a plurality of resistor NR0 to NRn that may be coupled between the plurality of transistors P0 to Pn and a ground terminal VSSQ, respectively.

The first comparator 20 may compare the first line voltage P_out with a reference voltage Vref in response to a first code adjustment enable signal P_en and output a first comparison signal Pcmp_out.

The first control unit 100 enables a reset signal RST that may serve as, for example, a code error determining signal when the first code Pcode<0:N> reaches a code value for which a resistance value may be the maximum (for example, when N is 4, 11111) with the first code adjustment enable signal P_en being disabled. As shown in FIG. 4, the first control unit 100 may include, for example, a first inverter IV1 to which the first code adjustment enable signal P_en is input and a first XNOR gate XNOR1 to which an output signal of the first inverter IV1 and the first code Pcode<0:N> are input.

The ODT output driver 40 may divide the power supply voltage VDDQ at a resistance ratio, for example, that corresponds to a second code Ncode<0:N> and output a second line voltage N_out. The ODT output driver 40 may be modeled in the same manner as a data output driver.

As shown in FIG. 5, the ODT output driver 40 may include, for example, a plurality of transistors PM0 to PMn that may be coupled to a power supply terminal VDDQ and are turned on in response to the first code Pcode<0:N>, a plurality of resistors RP0 to RPn that may be coupled between the plurality of transistors PM0 to PMn and the ground terminal VSSQ, respectively, a plurality of resistors RN0 to RNn coupled to the plurality of resistors RP0 to RPn, respectively, and a plurality of transistors NM0 to NMn that may be coupled between the plurality of resistors RN0 to RNn and the ground terminal VSSQ and are turned on in response to the second code Ncode<0:N>.

The second comparator 50 may compare the second line voltage N_out with the reference voltage Vref in response to a second code adjustment enable signal N_en and output a second comparison signal Ncmp_out.

The second control unit 500 may enable the reset signal RST that may serve as, for example, a code error determining signal when the second code Ncode<0:N>reaches a code value for which a resistance value may be the maximum (for example, when N is 4, 00000) with the second code adjustment enable signal N_en being disabled. As shown in FIG. 6, the second control unit 500 may include, for example, a second inverter IV2 to which the second code adjustment enable signal N_en is input, a plurality of inverters IV3 to IVn to which bits of the second code Ncode<0:N> are input, and a second XNOR gate XNOR2 to which output signals of the inverters IV2 to IVn are input.

Figure 7:
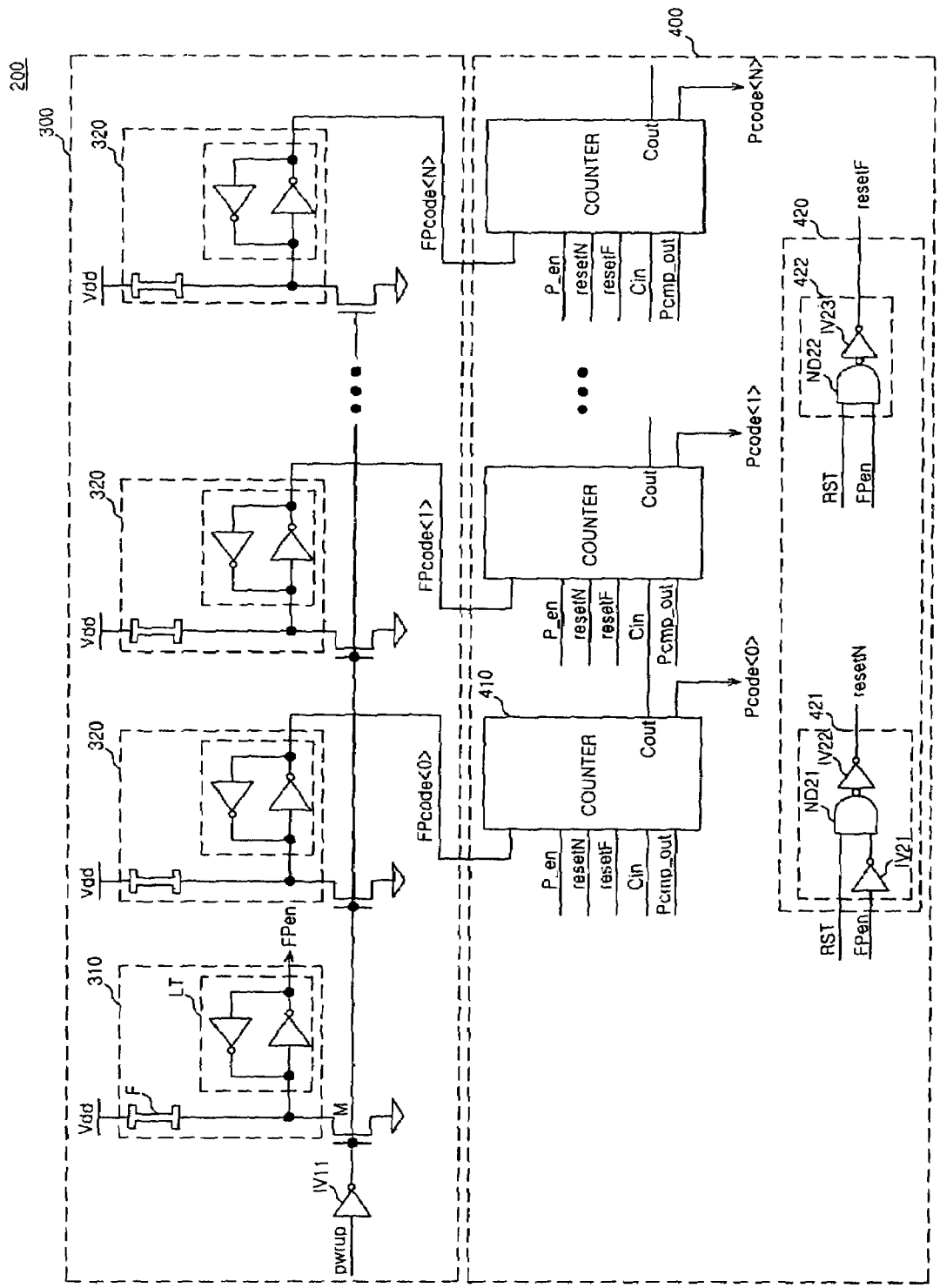
FIG. 7 is a circuit block diagram illustrating an exemplary first code adjusting unit shown in FIG. 2.

As shown in FIG. 7, the exemplary first code adjusting unit 200 may include, for example, a fuse set 300 and a first register 400. The first code adjusting unit 200 may count up or down the first code Pcode<0:N> in response to the first comparison signal Pcmp_out output from the first comparator 20 and store the first code Pcode<0:N>. When the first control unit 100 generates a reset signal RST, the first code adjusting unit 200 may reset the first code Pcode<0:N>, for example, to a predetermined reset code or a first fuse code FPcode<0:N>in response to a first fuse code enable signal FPen.

The exemplary first fuse set 300 may include as a code setting unit, for example, a first fuse circuit 310 for generating the first fuse code enable signal FPen and a plurality of second fuse circuits 320 for generating the first fuse code FPcode<0:N>. In the first fuse circuit 310 and the second fuse circuits 320, a fuse F and a transistor M may be coupled between a power supply terminal Vdd and a ground terminal, and a latch LT may be coupled to a node between the fuse F and the transistor M.

The first register 400 may include, for example, a plurality of counters 410 and a selection signal generating unit 420.

The plurality of counters 410 may receive the first fuse code FPcode<0:N>, the first code adjustment enable signal P_en, a first selection signal resetN, a second selection signal resetF, a carry Cin, and the first comparison signal Pcmp_out and output the first code Pcode<0:N> and a carry Cout.

The exemplary selection signal generating unit 420 may receive the reset signal RST and the first fuse code enable signal FPen and generate the first selection signal resetN and the second selection signal resetF. The first selection signal resetN may be used to reset the first code Pcode<0:N> to the reset code. The second selection signal resetF may be used to reset the first code Pcode<0:N> to the first fuse code FPcode<0:N>.

A first selection signal generating unit 421 may include, for example, a first inverter IV21 to which a first fuse code enable signal FPen is input, a first NAND gate ND21 to which an output signal of the first inverter IV21 and the reset signal RST are input, and a second inverter IV22 that receives an output signal of the first NAND gate ND21 and outputs the first selection signal resetN.

A second selection signal generating unit 422 may include, for example, a second NAND gate ND22 to which the reset signal RST and the first fuse code enable signal FPen are input and a third inverter IV23 that receives an output signal of the second NAND gate ND22 and outputs the second selection signal resetF.

As shown in FIG. 8, the exemplary counter 410 may include a flip-flop 411, a carry output unit 412, a switching unit 413, and a normal code control clock generating unit 414.

The flip-flop 411 may store and output an input signal Din in response to a normal code control clock CLKD/CLKZ. The flip-flop 411 may output a first fuse code FPcode<0> or the reset code according to the first selection signal resetN and the second selection signal resetF.

As shown in FIG. 9, the exemplary flip-flop 411 may include a fuse code control clock generating unit 411-1, a fuse code processing unit 411-2, a normal code processing unit 411-3, and a reset code processing unit 411-4.

The exemplary fuse code control clock generating unit 411-1 may include, for example, a plurality of inverters IV43 and IV44. In the disclosed fuse code control clock generating unit 411-1, the inverter IV43 inverts the second selection signal resetF to generate a fuse code control clock resetFz, and the inverter IV44 inverts the fuse code control clock resetFz to generate a fuse code control clock resetFd.

The exemplary fuse code processing unit 411-2 may include, for example, a pass gate PG41 having control terminals to which the fuse code control clocks resetFz and resetFd are input and an input terminal to which the first fuse code FPcode<0> is input, and an inverter IV41 to which an output signal of the pass gate PG41 is input. The fuse code processing unit 411-2 may output the first fuse code FPcode<0> in response to the fuse code control clocks resetFz and resetFd that may be generated on the basis of the second selection signal resetF.

The exemplary normal code processing unit 411-3 may include, for example, a first pass gate PG42 having control terminals to which the normal code control clocks CLKZ and CLKD are input and an input terminal to which an input signal Din is input as a normal code, a first latch LT41 to which an output signal of the first pass gate PG42 is input, and a second pass gate PG43 having control terminals to which the normal code control clocks CLKD and CLKZ having opposite phases are input and an input terminal to which an output signal of the first latch LT41 is input. The normal code processing unit 411-3 may further include a second latch LT42 for synchronizing the phase and maintaining an output level. The normal code processing unit 411-3 may store a normal code as the input signal Din during first half of one period of each of the normal code control clocks CLKD and CLKZ, and output the normal code during the other half of one period of each of the normal code control clocks CLKD and CLKZ.

The exemplary reset code processing unit 411-4 may include, for example, an inverter IV42 to which the first selection signal resetN is input, a first transistor M41 that outputs a power supply voltage level Vdd according to the output of the inverter IV42, a first switch SW41 coupled between the first transistor M41 and the second latch LT42, a second transistor M42 that outputs a ground level in response to the first selection signal resetN, a second switch SW42 coupled between the second transistor M42 and the second latch LT42, a third switch SW43 coupled to a node between the first transistor M41 and the first switch SW41, and a fourth switch SW44 coupled between the third switch SW43 and the second transistor M42. In the reset code processing unit 411-4, when the first selection signal resetN is generated, the transistors M41 and M42 are turned on and a predetermined reset code is output by a plurality of switches SW41 to SW44.

Referring to FIG. 8, the carry output unit 412 may include, for example, a NOR gate NR31 that receives an input carry Cin and an output signal Dout of the flip-flop 411 or an inverted signal of the output signal Dout of the flip-flop 411 and generates an output carry Cout.

The exemplary switching unit 413 may include, for example, a plurality of inverters IV31 to IV33 and a plurality of pass gates PG31 to PG34. In the switching unit 413, the inverters IV31 and IV33 and the pass gates PG31 and PG32 allow the output signal Dout of the flip-flop 411 to have the original phase or an inverted phase according to the input carry Cin, and the switching unit 413 feeds back the output signal Dout to the flip-flop 411 as the input signal Din. The disclosed switching unit 413 may use the inverters IV32 and IV33 and the pass gates PG33 and PG34 to allow the output signal Dout of the flip-flop 411 to have the original phase or an inverted phase according to a first comparison signal Pcmp_out, and output the output signal Dout to the carry output unit 412.

The exemplary normal code control clock generating unit 414 may include, for example, a plurality of inverters IV35 and IV36. In the disclosed normal code control clock generating unit 414, the inverter IV35 inverts a first code adjustment enable signal P_en to generate the normal code control clock CLKZ, and the inverter IV36 inverts the normal code control clock CLKZ to generate the normal code control clock CLKD.

Referring back to FIG. 2, the exemplary second code adjusting unit 600 may include a second fuse set 700 and a second register 800. The second code adjusting unit 600 may count up or down the second code Ncode<0:N> according to a second comparison signal Ncmp_out output from the second comparator 50 and stores the second code Ncode<0:N>. When the second control unit 500 generates the reset signal RST, the second code adjusting unit 600 may reset the second code Ncode<0:N> to a predetermined reset code or the second fuse code FNcode<0:N> according to a second fuse code enable signal Fnen. The circuit configuration of the second fuse set 700 may be the same as that of the first fuse set 300, and the circuit configuration of the second register 800 may be the same as that of the first register 400.

Next, an example of the operation of the on-die termination circuit of the semiconductor memory apparatus according to an embodiment of the invention will be described below.

A technique for determining whether a normal code adjusting error occurs and resetting the normal code, a technique for selecting a code value for reset from a predetermined reset code or a separate fuse code, and a technique for performing a test to adjusting an error in the fuse code value due to a PVT (process, voltage, and temperature) variation are disclosed.

First, an exemplary a method of performing a test to adjusting a fuse code will be described.

A difference between a resistance value of a driver and the actual resistance value is measured when reset codes are input to an input driver and an output driver of a semiconductor memory apparatus. The reset codes are output from the first register 400 and the second register 800 shown in FIG. 2 by turning on or off the plurality of switches SW41 to SW44 shown in FIG. 9.

Based on the measured result, when the difference between the resistance values is beyond an error range, fuses F of a plurality of second fuse circuits 320 in the first fuse set 300 or the second fuse set 700 are cut such that the difference between the resistance values falls within the error range. Then, the fuse F of the first fuse circuit 310 is cut to generate the first and second fuse code enable signals FPen and FNen. When the circuit is initialized with the fuse F of the first fuse circuit 310 cut and a power-up signal power-up may be generated, the first or second fuse code enable signal FPen or FNen is activated at a high level.

Based on the measured result, when there is no difference between the resistance values or when the difference between the resistance values falls within the error range, all of the fuses F of the first and second fuse circuits 310 and 320 in the first or second fuse set 300 or 700 are not cut. Even when the circuit is initialized without cutting the fuse F of the first fuse circuit 310 and the power-up signal power-up is generated, the first or second fuse code enable signal FPen or FNen is inactivated at a low level.

Next, a example of a process of adjusting and resetting the first code Pcode<0:N> and the second code Ncode<0:N> after the fuse code adjustment is completed will be described below.

An exemplary process of adjusting the first code Pcode<0:N> and a process of adjusting the second code Ncode<0:N> may be performed simultaneously or performed sequentially.

An exemplary process of adjusting the first code Pcode<0:N> is as follows.

The first code Pcode<0:N> set by the first register 400 is input to the ODT input driver 10.

The ODT input driver 10 divides the power supply voltage VDDQ at a resistance ratio of the resistor connected according to the first code Pcode<0:N> and a line impedance detecting resistor ZQ and outputs a first line voltage P_out.

The first comparator 20 compares the first line voltage P_out and the reference voltage Vref according to the first code adjustment enable signal P_en and outputs the first comparison signal Pcmp_out.

The first register 400 counts the first code Pcode<0:N> according to the first comparison signal Pcmp_out As shown in FIG. 7, when the reset signal RST is not activated, neither the first selection signal resetN nor the second selection signal resetF is activated. When neither the first selection signal resetN nor the second selection signal resetF is activated, the first register 400 counts the first code Pcode<0:N> regardless of the first fuse code FPcode<0:N> and the reset code.

The ODT input driver 10 feeds back the first line voltage P_out corresponding to the counted first code Pcode<0:N> to the first comparator 20. The first comparator 20 receives the first line voltage P_out and repeatedly performs the comparing operation and an operation for outputting the first comparison signal Pcmp_out.

The first code adjustment enable signal P_en is inactivated after a predetermined time.

When the first code adjustment enable signal P_en is inactivated, the first comparator 20 stops, and the first code Pcode<0:N> at that time is stored.

As shown in FIG. 10, even when the first code Pcode<0:N> is continuously counted during a period for which the first code adjustment enable signal P_en is enabled, mismatching may occur between the first line voltage P_out and the reference voltage Vref. When the first comparison signal Pcmp_out is maintained at a high level, the first code Pcode<0:N> reaches a code value, for example, (11111) for which the resistance value of the input driver may be the maximum, and does not vary any longer, so that the first code adjustment enable signal P_en is disabled.

The first control unit 100 shown in FIG. 2 receives the first code Pcode<0:N> having reached the code value, for example, (11111) and the first code adjustment enable signal P_en that has been inactivated at a low level and activates the reset signal RST at a high level.

When the first fuse code enable signal FPen is inactivated at a low level with the reset signal RST being activated at a high level, the selection signal generating unit 420 of the first register 400 shown in FIG. 7 activates the first selection signal resetN at a high level and inactivates the second selection signal resetF at a low level.

When the first selection signal resetN is activated at a high level, the flip-flop 411 of the first register 400 shown in FIG. 9 outputs a predetermined reset code to reset the first code Pcode<0> to the reset code. When the first selection signal resetN changes to the high level, the inverter IV42 turns on the transistor M41 and the switch SW44 is turned on, so that a reset code having a logical value of '0' is output from the latch LT42. Since the second selection signal resetF is at a low level, the pass gate PG41 is turned off, and the first fuse code FPcode<0> is interrupted. Since the first code adjustment enable signal P_en is in an inactive state, the pass gate PG42 is turned off according to the output of the normal code control clock generating unit 414 shown in FIG. 8, and the input signal Din is also interrupted. The remaining first codes Pcode<1:N> are reset to the reset code.

Meanwhile, when the first fuse code enable signal FPen is activated at a high level with the reset signal RST being activated at a high level, the selection signal generating unit 420 of the first register 400 shown in FIG. 7 activates the second selection signal resetF at a high level and inactivates the first selection signal resetN at a low level.

When the second selection signal resetF is activated at a high level, the flip-flop 411 of the first register 400 shown in FIG. 9 outputs the first fuse code FPcode<0> to reset the first code Pcode<0> to the first fuse code FPcode<0>. When the second selection signal resetF is activated at a high level, the fuse code control clock generating unit 411-1 generates fuse code control clocks resetFz and resetFd. Then, the first fuse code FPcode<0> is output through the pass gate PG41, the inverter IV41, and the latch LT42. Since the first selection signal resetN is at a low level, the inverter IV42 turns off the transistor M41. Since the first code adjustment enable signal P_en is in an inactive state, the pass gate PG42 is turned off according to the output of the normal code control clock generating unit 414 shown in FIG. 8, and the input signal Din is interrupted. The remaining first codes Pcode<1:N> are reset to the first fuse codes FPcode<1:N>.

An operation for adjusting the second code Ncode<0:N> may be performed in the same manner as that in which the operation for adjusting the first code Pcode<0:N> is performed, and an example of the operation for adjusting the second code Ncode<0:N> will be described below.

The ODT output driver 40 feeds back the second line voltage N_out corresponding to the counted second code Ncode<0:N> to the second comparator 50. The second comparator 50 receives the second line voltage N_out and repeatedly performs the comparing operation and an operation for outputting the second comparison signal Ncmp_out.

As shown in FIG. 11, even when the second code Ncode<0:N> is continuously counted during a period for which the second code adjustment enable signal N_en is enabled, mismatching may occur between the second line voltage N_out and the reference voltage Vref. When the second comparison signal Ncmp_out is maintained at a low level, the second code Ncode<0:N> reaches a code value, for example, (00000) for which the resistance value of the input driver may be the maximum, and does not vary any longer, so that the second code adjustment enable signal N_en is disabled.

The second control unit 500 shown in FIG. 2 receives the second code Ncode<0:N> having reached the code value, for example, (00000) and the second code adjustment enable signal N_en that has been inactivated at a low level and activates the reset signal RST at a high level.

When the second fuse code enable signal FNen is inactivated at a low level with the reset signal RST being activated at a high level, the second register 800 shown in FIG. 2 resets the second code Ncode<0:N> to the reset code.

When the second fuse code enable signal FNen is activated at a high level with the reset signal RST being activated at a high level, the second register 800 shown in FIG. 2 resets the second code Ncode<0:N> to the second fuse code FNcode<0:N> output from the second fuse set 700.

It will be apparent to those skilled in the art that various modifications and changes may be made without departing from the scope and spirit of the present invention. Therefore, it should be understood that the above embodiments are not limitative, but illustrative in all aspects. The scope of the present invention is defined by the appended claims rather than by the description preceding them, and therefore all changes and modifications that fall within metes and bounds of the claims, or equivalents of such metes and bounds are therefore intended to be embraced by the claims.

As described above, according to the above-mentioned embodiments of the invention, the on-die termination circuit of the semiconductor memory apparatus can prevent a code adjustment error, and variably set a code value used to prevent the code adjustment error to adapt to PVT (process, voltage, and temperature) variation. Therefore, it is possible to normally input and output data even when the PVT variation occurs, and thus further improve the performance of a semiconductor memory apparatus.

What is claimed is:

1. An on-die termination circuit of a semiconductor memory apparatus, comprising:
   a comparator configured to compare a voltage corresponding to a normal code with a reference voltage to output a comparison signal;
   a code adjusting unit configured to vary the normal code according to the comparison signal to obtain a varied normal code, outputs the varied normal code, and resets the normal code to a predetermined reset code or a variable fuse code according to a reset signal; and
   a control unit configured to determine whether a code error occurs on the basis of the normal code at a time when the adjustment of a code is completed and generate the reset signal.

2. The on-die termination circuit of claim 1, wherein the code adjusting unit includes:
   a code setting unit configured to set the fuse code and output a fuse code enable signal for determining whether to use the fuse code; and
   a register configured to count the normal code according to the comparison signal, store the normal code, and select one of the reset code and the fuse code according to the reset signal or the fuse code enable signal to reset the normal code.

3. The on-die termination circuit of claim 2, wherein the code setting unit includes:
   a first fuse circuit configured to generate the fuse code enable signal; and
   a plurality of second fuse circuits configured to generate the fuse code.

4. The on-die termination circuit of claim 3, wherein the first fuse circuit includes:
   a fuse coupled to a power supply terminal;
   a transistor coupled between the fuse and a ground terminal; and
   a latch coupled to a node between the fuse and the transistor.

5. The on-die termination circuit of claim 3, wherein the first and second fuse circuits comprise the same structure.

6. The on-die termination circuit of claim 3, wherein the first and second fuse circuits are initialized by a power-up signal.

7. The on-die termination circuit of claim 2, wherein the register includes a plurality of counters configured to receive a selection signal for selecting one of the reset code and the fuse code and output the normal code based thereon.

8. The on-die termination circuit of claim 7, wherein the register further includes a selection signal generating unit configured to receive the reset signal and the fuse code enable signal and generate the selection signal.

9. The on-die termination circuit of claim 8, wherein the selection signal generating unit includes:
   a first selection signal generating unit configured to receive the reset signal and the fuse code enable signal and generates a first selection signal for selecting the reset code; and
   a second selection signal generating unit configured to receive the reset signal and the fuse code enable signal and generates a second selection signal for selecting the fuse code.

10. The on-die termination circuit of claim 9, wherein the first selection signal generating unit comprises a logic circuit configured to calculate a logical product of the reset signal and an inverted fuse code enable signal.

11. The on-die termination circuit of claim 9, wherein the second selection signal generating unit comprises a logic circuit configured to calculate a logical product of the reset signal and the fuse code enable signal.

12. The on-die termination circuit of claim 9,
wherein the counter includes:
a flip-flop configured to store and output an input signal according to a normal code control clock, and output as an output signal the fuse code or the reset code according to the first selection signal and the second selection signal;
a carry output unit configured to receive an input carry and the output signal of the flip-flop or an inverted signal of the output signal of the flip-flop and generate an output carry;
a switching unit configured to feed back the output signal of the flip-flop or the inverted signal of the output signal of the flip-flop according to the input carry, and output the output signal of the flip-flop or the inverted signal of the output signal of the flip-flop to the carry output unit according to the comparison signal; and
a normal code control clock generating unit configured to generate a normal code control clock based on a code adjustment enable signal.

13. The on-die termination circuit of claim 12,
wherein the flip-flop includes:
a fuse code processing unit configured to output the fuse code in response to a fuse code control clock that is generated on the basis of the second selection signal;
a normal code processing unit configured to store and output the normal code according to the normal code control clock; and
a reset code processing unit configured to output the reset code according to the first selection signal.

14. The on-die termination circuit of claim 13,
wherein the fuse code processing unit includes a switching element having a control terminal configured to receive the fuse code control clock as input and an input terminal configured to receive the fuse code as input.

15. The on-die termination circuit of claim 13,
wherein the normal code processing unit includes:
a first switching element having a control terminal configured to receive the normal code control clock as input and an input terminal configured to receive the normal code as input and configured to provide an output signal based thereon;
a latch configured to receive the output signal of the first switching element as input and provide an output signal; and
a second switching element having a control terminal configured to receive a clock signal having an opposite phase of the normal code control clock input to the first switching element as input and an input terminal configured to receive the output signal of the latch as input.

16. The on-die termination circuit of claim 13,
wherein the reset code processing unit includes:
a first transistor configured to output a first logic level signal according to the first selection signal;
a first switch coupled between the first transistor and an output terminal of the flip-flop;
a second transistor configured to output a signal of opposite level of the first logic level signal according to the first selection signal; and
a second switch coupled between the second transistor and the output terminal of the flip-flop.

17. The on-die termination circuit of claim 13,
wherein the flip-flop further includes:
a fuse code control clock generating unit configured to generate the fuse code control clock based on the second selection signal.

18. The on-die termination circuit of claim 17,
wherein the fuse code control clock generating unit includes a plurality of inverting elements configured to sequentially invert the second selection signal.

19. The on-die termination circuit of claim 12,
wherein the carry output unit includes a logic element configured to, when the input carry has a first logic level and the output signal of the flip-flop has the first logic level, output the output carry having the first logic level.

20. The on-die termination circuit of claim 12,
wherein the switching unit includes:
first and second switching elements configured to output the output signal of the flip-flop or the inverted signal of the output signal of the flip-flop according to the input carry; and
third and fourth switching elements configured to input the output signal of the flip-flop or the inverted signal of the output signal of the flip-flop to the carry output unit according to the comparison signal.

21. The on-die termination circuit of claim 12,
wherein the normal code control clock generating unit includes a plurality of inverting elements configured to sequentially invert the code adjustment enable signal.

22. The on-die termination circuit of claim 1,
wherein the control unit is configured to generate the reset signal when the normal code at the time when a code is completely adjusted reaches a maximum value.

23. The on-die termination circuit of claim 1,
wherein the control unit includes:
an inverter configured to receive the code adjustment enable signal input to provide an output signal; and
an XNOR gate configured to receive the output signal of the inverter and the normal code as input.

24. The on-die termination circuit of claim 1,
wherein the control unit is configured to generate the reset signal when the normal code at the time when a code is completely adjusted reaches a minimum value.

25. The on-die termination circuit of claim 1,
wherein the control unit includes:
a first inverter configured to receive the code adjustment enable signal as input and to provide an output signal;
a plurality of second inverters configured to receive bits of the normal code as input and to provide an output signal; and
an XNOR gate configured to receive output signals of the first and second inverters as input.

* * * * *